United States Patent [19]
Tanaka et al.

[11] Patent Number: 4,672,363
[45] Date of Patent: Jun. 9, 1987

[54] FREQUENCY MODULATION CODING METHODS WITH REDUCED TRANSITION INTERVALS

[75] Inventors: Masato Tanaka; Takuji Himeno, both of Tokyo, Japan

[73] Assignee: Sony Corporation, Tokyo, Japan

[21] Appl. No.: 705,345

[22] PCT Filed: Jun. 15, 1984

[86] PCT No.: PCT/JP84/00312
§ 371 Date: Feb. 15, 1985
§ 102(e) Date: Feb. 15, 1985

[87] PCT Pub. No.: WO85/00067
PCT Pub. Date: Jan. 3, 1985

[30] Foreign Application Priority Data
Jun. 17, 1983 [JP] Japan .................. 58-108697

[51] Int. Cl.$^4$ .................................... H03M 7/00
[52] U.S. Cl. ........................ 340/347 DD; 360/40; 360/41; 360/42
[58] Field of Search .................. 360/40–44; 340/347 DD

[56] References Cited
PUBLICATIONS

Taub, Elimination of DC Component in MFM-Type Codes, IBM Technical Disclosure Bulletin, vol. 21, No. 1, 6/1978, pp. 361 & 362.
Frazier, Improved Modified Frequency Modulation Code, IBM Technical Disclosure Bulletin, vol. 24, No. 4, 9/1981, pp. 2055 & 2056.

Primary Examiner—T. J. Sloyan
Attorney, Agent, or Firm—Lewis H. Eslinger; Alvin Sinderbrand

[57] ABSTRACT

There is provided a method of modulating a data bit series consisting of a first value (e.g., 1) and a second value (e.g., 0) whereby a transition as a state transition is caused so as to satisfy the following conditions of (a) to (d).
(a) The transition at the boundary portion of the bit cell which is sandwiched by bits 0.
(b) The transition at the central portion of the bit cell of bit 1.
(c) Among an even number of the bits of 1 which are sandwiched by bits 0, the transition is inhibited at the central portion of each bit cell of the last two bits of 1 and the transition is caused at the boundary portion of these two bit cells of 1.
(d) When at least one bit in a pattern which starts from the two bits of (01) appears at a location next to an even number of the bits of 1 subsequent to bit of 0, the transition is caused at the central portion of the bit cell of bit 0 between these two bits.

3 Claims, 7 Drawing Figures

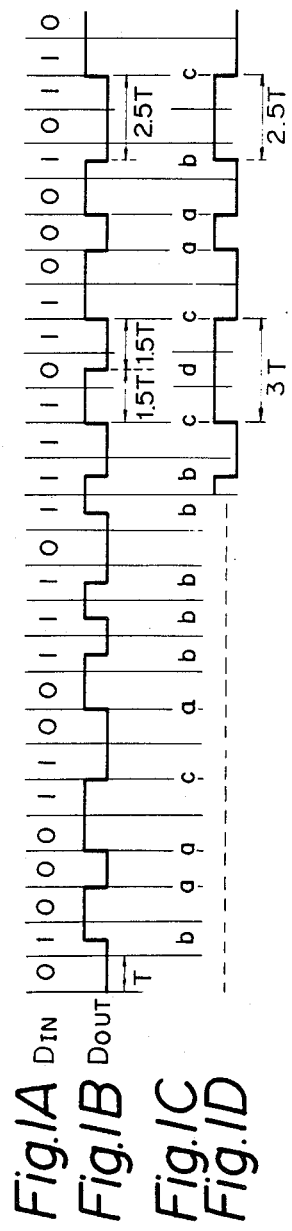
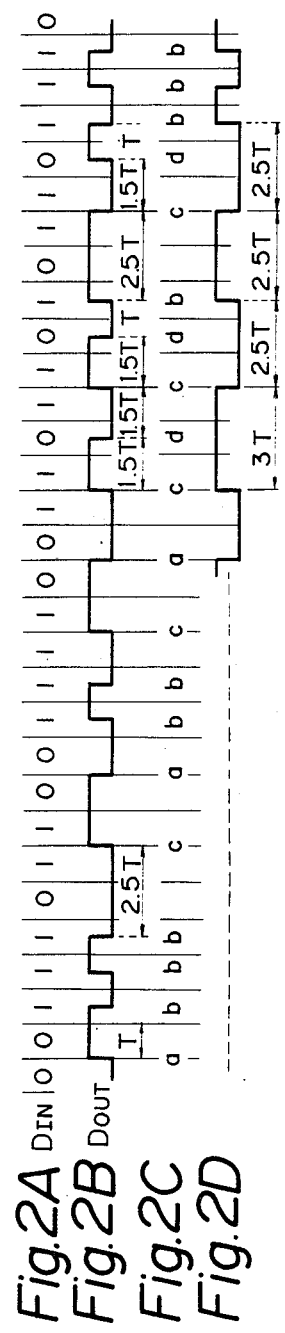

Fig. 6A NRZ 
Fig. 6B D IN 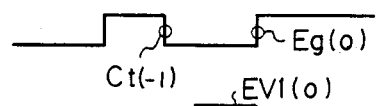

Fig. 7A NRZ 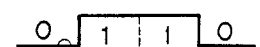
Fig. 7B D IN 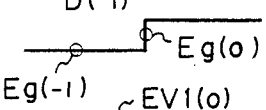
Fig. 7C EV 1 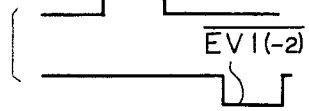

FREQUENCY MODULATION CODING METHODS WITH REDUCED TRANSITION INTERVALS

TECHNICAL FIELD

The present invention relates to a method of modulating digital data which is applied to the case where an information signal such as an audio signal or video signal is converted to a digital signal and is recorded on an optical disc or magnetic tape.

BACKGROUND ART

In case of recording a digital information signal, a digital modulation called a channel coding is performed to raise a recording density on a recording medium and to reduce the DC component of a transmission signal.

A Miller modulation is known as a conventional channel coding. However, the Miller modulation cannot reduce the DC component of the modulated output to zero. For example, in case of recording an audio PCM signal by a rotary head, a recording signal is transmitted through a rotary transformer. If the DC component is included in this recording signal, since the rotary transformer cannot transmit the DC component, there will be caused a problem such that the waveform of the recording signal is distorted. In the case where many low frequency components are included in the recording signal, it is necessary to extend the frequency characteristic of the rotary transformer to a low frequency band. Further, in case of using a recording method whereby the crosstalk between the adjacent tracks is suppressed by making the extending directions of the gap of the recording head differ with regard to the adjacent tracks, the effect of suppressing the crosstalk with respect to the low frequency component of the recording signal becomes insufficient.

In case of reproducing an optical disc whose surface is coated by a reflecting layer, DC noises are caused due to the dust adhered on the reflecting layer, scratches on the reflecting layer or the like. If the digital signal recorded on the disc includes no DC component, such DC noises can be eliminated by a filter.

From the above viewpoint, it is required to reduce the DC component of the recording signal to zero. For this purpose, a modified Miller (referred to as $M^2$) modulation has been proposed. Further, a modulating method (referred to as M3 modulation) having the effect of suppressing the DC component even more than the $M^2$ modulation has also been proposed.

In these $M^2$ and M3 modulating methods, the minimum transition interval of the modulated output is T (where, T is a length of one bit cell) and the maximum transition interval is 3T. It is desirable that the maximum transition interval, namely, the maximum value of the interval between data value transitions, be short in order to reduce the low frequency component and to improve the clock recovery capability in a reproducing circuit.

DISCLOSURE OF INVENTION

The present invention relates to a method of modulating binary digital data to reduce the DC component to zero and intends to propose a digital modulating method which can shorten the maximum transition interval as compared with the cases of the $M^2$ modulation and M3 modulation.

That is, since the invention can reduce the DC component to zero, by applying the invention to a channel coding in a recording apparatus using a rotary head, an optical disc reproducing apparatus or the like, the distortion (peak shift) of the recording waveform can be decreased and the low frequency noise can be eliminated. In addition, the invention can shorten the maximum transition interval as compared with the cases of the $M^2$ modulation and M3 modulation and can further reduce the low frequency component of the modulated output, and at the same time the clock recovery capability can be improved.

BRIEF DESCRIPTION OF THE DRAWINGS

FIG. 1 is a waveform diagram which is used in explanation of a first embodiment of the invention;

FIG. 2 is a waveform diagram which is used in explanation of a second embodiment of the invention;

FIGS. 6 and 7 are time charts which are used in explanation of this demodulating circuit.

BEST MODE FOR CARRYING OUT THE INVENTION

Figure 3:
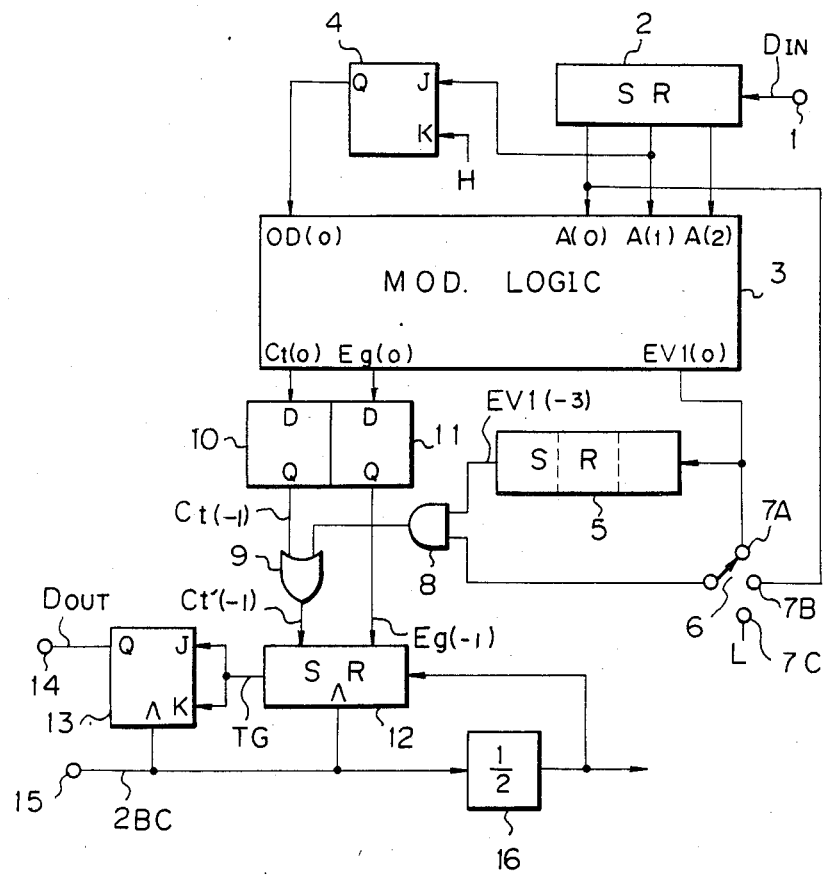
FIG. 3 is a block diagram of an example of a modulating circuit to which the invention is applied.

In embodiments of the present invention, a first value is set to a logical 1 and a second value is set to a logical 0. This correspondence may be obviously changed. The first embodiment of the invention will now be described.

In the first embodiment, the transition as the state transition is caused in accordance with the following rules (a) to (d).

(a) Transition at the boundary portion of the bit cells which is sandwiched by bits of 0.

(b) Transition at the central portion of the bit cell of bit of 1.

(c) With respect to the last two bits of 1 among an even number of bits of 1 which are sandwiched by bits 0, the transition at the central portion of each of bit cell is inhibited and the transition at the boundary portion of the bit cells is caused.

(d) When a pattern of (0110) appears after an even number of bits of 1 subsequent to a bit of 0, the transition is caused at the central portion of the bit cell of the first bit of 0 among the four bits of this pattern.

The above rules (a) and (b) are known as the M modulation. If only the rules (a) and (b) are adopted, the DC component will be caused in case of the n (where, $n \geq 1$ and n is an even number) data bit series which are sandwiched by bits of 0 such as (011...110). In the case where n is an odd number, the DC component is not caused since the polarity of 0 which locates at the forward position and the polarity of 0 which locates at the backward position are opposite. The occurrence of the DC component is discriminated by whether a digital sum variation DSV (an integration value when 1 is set to $+1$ and 0 is set to $-1$) converges to 0 or diverges.

Therefore, the rule (c) makes an even number of bits of 1 which are sandwiched by bits of 0 cause the DC component. According to the rules (a), (b) and (c), the maximum transition interval of 3T is caused. The rule (d) is therefore needed to prevent this.

FIG. 1A shows a data bit series $D_{IN}$ in which each one bit is arranged to each of a number of successive bit cells (each bit cell has a length of T). The modulation rules (a) to (d) are applied as shown in FIG. 1C, so as to form a modulated output data $D_{OUT}$ shown in FIG. 1B. In the case where the pattern of (0110) follows the four bits of 1 subsequent to the bit of 0 such as (01111) as shown in FIG. 1A, the transition at the central portion of the last two bits of 1 is inhibited due to the rule (c), but the transition at the boundary portion of the bit cells of these two bits of 1 is caused. Then, the transition at the central portion of the bit cell of the first bit of 0 among the four bits of (0110) is caused due to the rule (d). Therefore, the transition interval in this portion becomes 1.5T.

Different from the invention, FIG. 1D shows the modulated output when the output was modulated due to the rules (a), (b) and (c). Since the modulated output of FIG. 1D until the bit cells to which the rule (d) is applied has the same waveform as the modulated output of FIG. 1B, this portion is omitted in the diagram. As will be obvious from FIG. 1D, the maximum transition interval of 3T is caused if the rule (d) is not applied.

In the first embodiment of the present invention, the maximum transition interval can be shortened to 2.5T. The transition intervals that can be caused include four kinds of T, 1.5T, 2T, and 2.5T. In consideration of this point, A pattern which includes the transition interval of e.g., 3T can be used as a synchronizing pattern which is added to the modulated output.

The second embodiment of the invention will then be explained. In the second embodiment, the transition is caused in accordance with the following rules (a) to (d).

(a) The transition at the boundary portion of the bit cell which is sandwiched by bits of 0.

(b) The transition at the central portion of the bit cell of bit of 1.

(c) With respect to the last two bits of 1 among an even number of bits of 1 which are sandwiched by bits of 0, the transition at the central portion of each of these two bits of 1 is inhibited and the transition at the boundary portion of the bit cells of those two bits of 1 is caused.

(d) When a pattern of (01) follows an even number of bits of 1 subsequent to bit of 0, the transition is caused at the central portion of the bit cell of the bit of 0 between these two bits of (01).

The above rules (a), (b) and (c) are the same as those in the first embodiment. An applicable range of the rule (d) is wider than that of the rule (d) in the first embodiment.

As shown in FIG. 2C, either one of the modulation rules of (a) to (d) in the foregoing second embodiment is applied to a data bit series $D_{IN}$ in which each one bit is arranged to each of a number of successive bit cells as shown in FIG. 2A, so that a modulated output data $D_{OUT}$ shown in FIG. 2B is obtained. FIG. 2D shows the modulated output data when the rule (d) is not applied. However, in FIG. 2D, the portion of the same waveform as that of FIG. 2B until the bit cells to which the modulation rule (d) is applied is not shown.

In FIG. 2A, in the portion of the data bit series of (011011010), since two bits of 1 are sandwiched by bits of 0, the transition is caused at the boundary portion of the mutual bit cells of two bits of 1 due to the rule (c). Subsequently, the bit pattern of (01) follows, so that the rule (d) is applied to cause the transition at the central portion of the bit cell of bit of 0 between these two bits.

Further, the rule (c) is applied to the bit pattern of (0110) including the pattern of (01) to cause the transition at the boundary portion of the mutual bit cells of two bits of 1. With respect to the last two bits (10), the transition is caused at the central portion of the bit cell of bit 1. Consequently, the transition intervals become 1.5T, 1.5T, 1.5T, and T.

In the waveform shown in FIG. 2D when the rule (d) is not applied, the transition intervals in the portion of the above-mentioned data bit series become 3T and 2.5T. That is, the transition interval of 3T is divided into the two transition intervals of 1.5T, while the transition interval of 2.5T is divided into the transition intervals of 1.5T and T. As will be obvious from FIGS. 2B and 2D, the DSV when an attention is paid to only this portion becomes (+0.5) irrespective of whether the rule (d) is applied or not. In the second embodiment of the invention, the DC component can be set to zero and the maximum transition interval can be shortened to 2.5T.

Further, as can be seen from FIG. 2B, the transition interval of 2.5T is not continuously caused in the second embodiment of the invention. Unless the rule (d) is applied, there will occur a case where the transition intervals of 2.5T continue as shown in FIG. 2D. In consideration of this point, in the second embodiment of the invention, the bit pattern in which the transition intervals of 2.5T continue can be employed as the synchronizing pattern.

An example of a modulating circuit which is used to implement the modulating method according to the invention is shown in FIG. 3.

The data bit series $D_{IN}$ modulated in NRZ is supplied from an input terminal indicated at a reference numeral 1 and is converted from the serial data to the parallel data by a shift register 2. The shift register 2 has three bits and successive three bits A(0), A(1) and A(2) of the data bits are fetched and supplied to a modulating logic 3. The data bit A(0) denotes the present bit and the data bits A(1) and A(2) represent the bits in the future.

The bit A(1) is inputted as a J input to a JK flip flop 4. The data of 1 is always given as a K input to the flip flop 4. When the J input of the flip flop 4 becomes 1 and a bit clock BC is applied thereto, the output of the flip flop 4 is inverted and when the J input becomes 0, the output becomes 0. The output of the flip flop 4 is synchronized with the bit A(0). The toggle operation is performed in the interval when the successive bits of 1 which are sandwiched by bits of 0 are inputted; therefore, the output OD(0) of the flip flop 4 becomes 1 in the case where the number of bits of 1 which are sandwiched by bits of 0 is odd, while the output OD(0) becomes 0 when it is even. The output of the flip flop 4 is supplied to the modulating logic 3.

The modulating logic 3 is a combination circuit or ROM for producing a center transition signal $C_t(0)$ and an edge transition signal $E_g(0)$ which are expressed by the following logical expressions.

$$C_t(0) = A(0) \cdot A(1) \cdot A(2) + A(0) \cdot \overline{OD(0)} \cdot A(1) \cdot \overline{A(2)} + OD(0) \cdot \overline{A(1)}$$

$$E_g(0) = \overline{A(0)} \cdot \overline{A(1)} + OD(0) \cdot A(1) \cdot \overline{A(2)}$$

When the $C_t(0)$ is 1, the transition is caused at the central portion of the bit cell of A(0). The term of $A(0) \cdot A(1) \cdot A(2)$ becomes 1 when the subsequent two bits are together 1, namely, when the bit (a(0) is 1 and at the same time when it is not included in the last two bits of successive bits of 1. The next term of $A(0)\cdot\overline{OD(0)}\cdot A(1)\cdot\overline{A(2)}$ becomes 1 when the A(0) is included in the last two bits (A(0)A(1)) among successive bits of 1 which are sandwiched by bits of 0 and at the same time when the bit A(0) is the even-numbered bit of 1. The term of $OD(0)\cdot\overline{A(1)}$ becomes 1 when the bit A(0) is the odd-numbered bit 1 and at the same time when the next bit is 0. The fact that the $C_t(0)$ becomes 1 means that the transition is caused at the central portion of the bit cell due to the modulation rule (b).

When the $E_g(0)$ is 1, the transition is caused at the boundary portion of the bit cell of A(0). The term of $\overline{A(0)}\cdot\overline{A(1)}$ becomes 1 when two bits 0 continue. This term corresponds to the modulation rule (a). The term of $OD(0)\cdot A(1)\cdot\overline{A(2)}$ becomes 1 when the A(0) is the first bit of 1 of the two bits (11) followed by a bit of 0 and at the same time when the A(0) is the odd-numbered bit of 1 (namely, when the A(1) is the even-numbered bit of 1). This term corresponds to the modulation rule (c).

On the other hand, the modulating logic 3 outputs a discriminating signal $EV_1(0)$ which is expressed by the following logical expression in order to cause the transition due to the modulation rule (d).

$$EV_1(0) = OD(0)\cdot A(1)\cdot\overline{A(2)}$$

This signal $EV_1(0)$ is one of the terms which are included in the logical expression of the edge transition signal $E_g(0)$. The discriminating signal $EV_1(0)$ becomes 1 when the modulation rule (c) is applied similarly to the above.

The discriminating signal $EV_1(0)$ is supplied to a three-bits shift register 5 and to an input terminal 7A of a switching circuit 6. The switching circuit 6 has input terminals 7B and 7C also. The bit A(0) is supplied from the shift register 2 to the input terminal 7B and the input of 0 is always supplied to the input terminal 7C.

The output of the switching circuit 6 and a discriminating signal $EV_1(-3)$ which is delayed by amount of three bits by the shift register 5 are supplied to an AND gate 8. The output of the AND gate 8 is supplied to one input terminal of an OR gate 9. A center transition signal $C_t(-1)$ which is delayed by amount of one bit by a flip flop 10 is supplied to the other input terminal of the OR gate 9. An output $C_t'(-1)$ of the OR gate 9 and an edge transition signal $E_g(-1)$ which is delayed by amount of one bit by a flip flop 11 are supplied to parallel inputs of a shift register 12.

When the modulation in the first embodiment of the invention is performed, the input terminal 7A of the switching circuit 6 is selected. The input terminal 7B is selected when the modulation in the second embodiment of the invention is performed. The input terminal 7C is selected when the modulation is performed on the basis of the modulation rules (a), (b) and (c) excluding (d). The center transition signal due to the modulation rule (d) in the first or second embodiment is fetched as the output of the AND gate 8. Since the input of 0 is always supplied to the input terminal 7C, the output of the AND gate 8 always becomes 0, so that the modulation rule (d) is not used.

The shift register 12 performs the parallel to serial conversion and its serial output TG is inputted to a toggle flip flop 13. The output of the flip flop 13 is fetched as the modulated output $D_{OUT}$ at an output terminal 14. A clock 2BC having a period of 0.5 T is supplied to a terminal 15 and this clock 2BC is inputted as the clock signal to the shift register 12 and to the flip flop 13. On the other hand, the bit clock BC having a period of T which was formed by frequency dividing the clock 2BC by a ½ frequency divider 16 is used as a shift/load control signal for the shift register 12, and at the same time it is inputted as the clock signal to the other shift registers 2 and 5 and to the flip flops 4, 10 and 11. The shift register 12 executes the shifting operation in response to the clock 2BC during the interval when the clock BC is 1, while it performs the parallel loading operation during the interval when the clock BC is 0.

Figure 4:
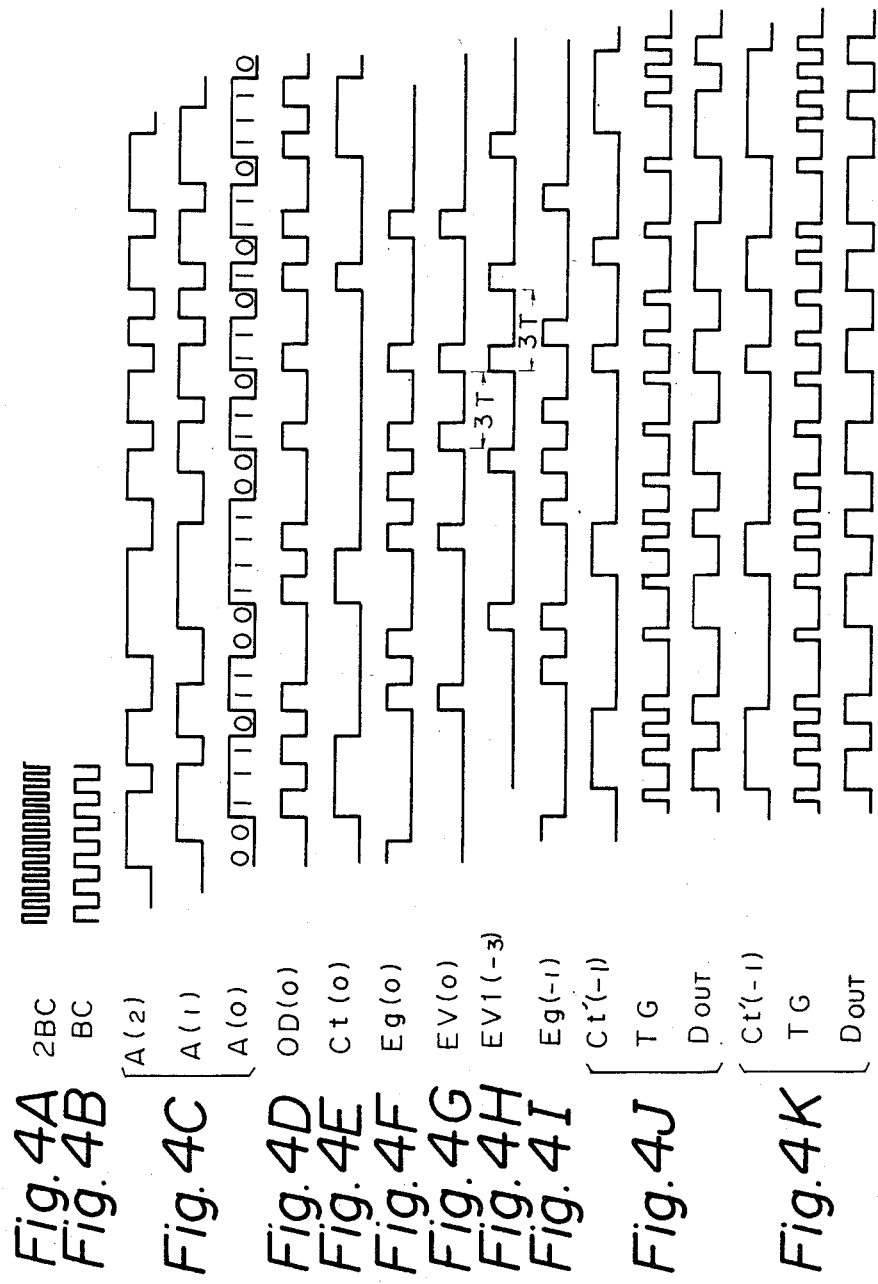
FIG. 4 are time charts which are used in explanation of this modulating circuit.

FIG. 4 shows time charts for this modulating circuit, in which FIG. 4A shows the clock $\overline{2BC}$ having the period of 0.5 T and FIG. 4B shows the clock BC having the period of T. FIG. 4 shows the signal waveform when the input data bit series $D_{IN}$ shown in FIG. 2A as an example is added.

Therefore, as shown in FIG. 4C, three data bit series which are delayed by every period of T appear from the shift register 2 and the bits of A(2), A(1) and A(0) are respectively included in these series. FIG. 4D shows a signal OD(0) which becomes 1 when the bit A(0) is 1 and the odd-numbered bit of the successive bit of 1. FIG. 4E shows the center transition signal $C_t(0)$ which becomes 1 at the bit cell that causes the transition at the central portion. FIG. 4F shows the edge transition signal $E_g(0)$ which becomes 1 at the bit cell that causes the transition at the edge portion. This edge transition signal $E_g(0)$ is delayed by amount of T by the flip flop 11 and becomes the edge transition signal $E_g(-1)$ shown in FIG. 4I.

The edge transition signal $E_g(0)$ becomes 1 due to the modulation rule (c) during the interval when the discriminating signal $EV_1(0)$ shown in FIG. 4G is 1. This discriminating signal $EV_1(0)$ is delayed by amount of 3 T by the shift register 5 and becomes the pulse signal $EV_1(-3)$ shown in FIG. 4H.

When the first embodiment of the invention, i.e., the input terminal 7A of the switching circuit 6 is selected, the AND output of both $EV_1(0)$ and $EV_1(-3)$ is supplied to the OR gate 9 together with the $C_t(-1)$. The output $C_t'(-1)$ of the OR gate 9 and the $E_g(-1)$ are loaded in parallel into the shift register 12 in response to the bit clock BC and are outputted in response to the clock 2BC. Thus, the pulse signal TG shown in FIG. 4J is outputted from the shift register 12 and the flip flop 13 is inverted at the trailing edge of the pulse signal TG, so that the modulated output $D_{OUT}$ shown in FIG. 4J is formed.

In the second embodiment of the invention whereby the input terminal 7B of the switching circuit 6 is selected, the AND output of the delayed discriminating signal $EV_1(-3)$ (FIG. 4H) and A(0)(FIG. 4C) is supplied to the OR gate 9, so that the output $C_t'(-1)$ of the OR gate 9 shown in FIG. 4K is produced. As shown in FIG. 4K, the output TG from the shift register 12 is supplied to the flip flop 13, so that the modulated output $D_{OUT}$ is obtained. This modulated output $D_{OUT}$ is identical to the waveform shown in FIG. 2B.

Figure 5:
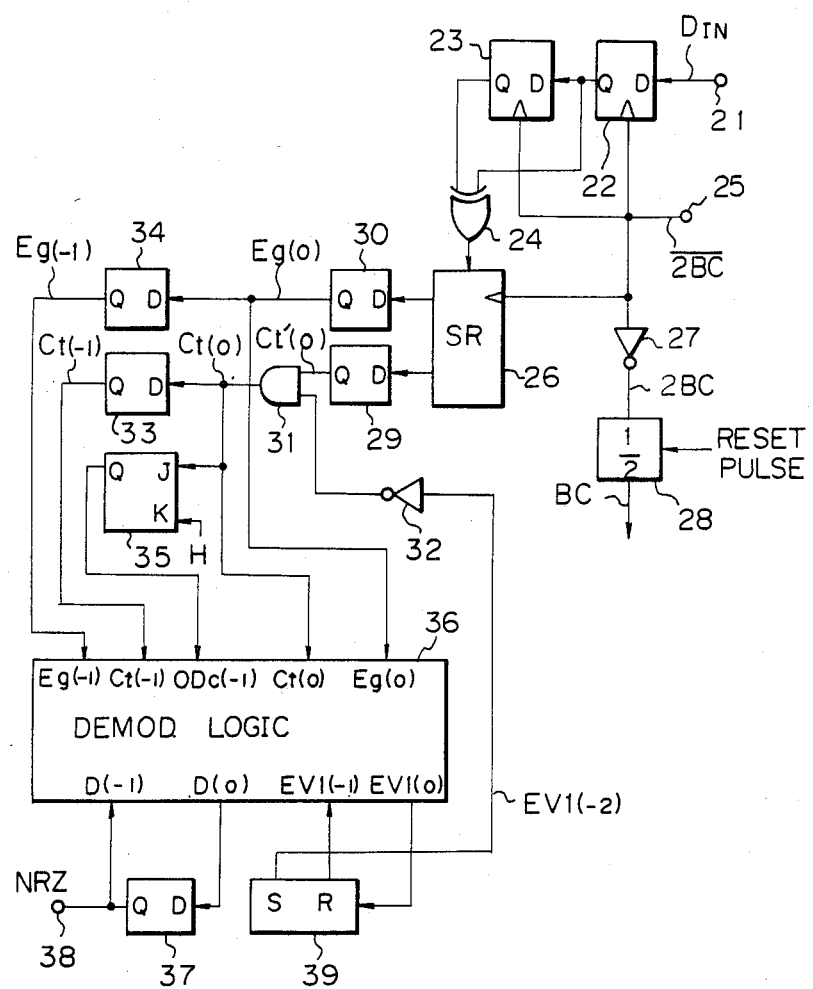
FIG. 5 is a block diagram of an example of a demodulating circuit to which the invention is applied.

FIG. 5 shows an arrangement of an example of a demodulating circuit. This demodulating circuit can be applied to any of the first embodiment, second embodiment and modulation using the modulation rules (a), (b) and (c) of the invention. The reproduced modulated signal $D_{IN}$ is supplied to an input terminal indicated at 21. The input data $D_{IN}$ to the demodulating circuit is supplied to a cascade connection of flip flops 22 and 23. A clock 2BC having the period of 0.5 T which is extracted from the input data $D_{IN}$ and is supplied from a terminal 25 is inputted as a clock signal to the flip flops 22 and 23. The outputs of the flip flops 22 and 23 are supplied to an exclusive OR gate 24 and the transition detecting signal is fetched at the output of the exclusive OR gate 24. The transition detecting signal is the pulse signal which becomes 1 during the interval of 0.5 T at the transition position.

This transition detecting signal is inputted to a shift register 26 and is subjected to the process for serial to parallel conversion, so that a two-bit parallel signal is derived. The shift register 26 performs the shifting operation in response to the clock $\overline{2BC}$. The clock $\overline{2BC}$ is inverted by an inverter 27 and is frequency divided by a ½ frequency divider 28 so as to form the bit clock BC. A reset pulse which is formed by detecting the synchronizing pattern added to the modulated signal is supplied to the ½ frequency divider 28. The phase of the bit clock BC is made coincident with the phase of the bit clock for modulation. This bit clock BC is used for flip flops and registers which are provided after the shift register 26.

The two-bit parallel outputs of the shift register 26 are delayed by amount of one bit by flip flops 29 and 30, respectively, and become a center transition signal $C_t'(0)$ and the edge transition signal $E_g(0)$. This signal $C_t'(0)$ is supplied to one input terminal of an AND gate 31. A discriminating signal $EV_1(-2)$ mentioned later is supplied to the other input terminal of the AND gate 31 through an inverter 32. The center transition signal $C_t(0)$ which is outputted from the AND gate 31 becomes 1 at the bit cell of which the transition is caused at the central portion. The edge transition signal $E_g(0)$ from the flip flop 30 becomes 1 at the bit cell of which the transition is caused at the boundary portion.

The center transition signal $C_t(0)$ and edge transition signal $E_g(0)$ and the signals $E_g(-1)$ and $C_t(-1)$ which are obtained by respectively delaying those signals $C_t(0)$ and $E_g(0)$ by amount T through flip flops 33 and 34 are supplied to a demodulating logic 36. The center transition signal $C_t(0)$ is supplied to a J input of a JK flip flop 35. A K input of the flip flop 35 is always set to 1. Therefore, a pulse $OD_c(-1)$ which becomes 1 when the $C_t(-1)$ is 1 and at the same time when the $C_t(-1)$ is the odd-numbered bit of 1 is produced as an output of the flip flop 35. This pulse is supplied to the demodulating logic 36.

The demodulating logic 36 is the combinational circuit or ROM which produces outputs on the basis of the following logical expressions.

$$EV_1(0) = E_g(0) \cdot C_t(-1) \cdot \overline{OD_c(-1)} + E_g(0) \cdot E_g(-1) \cdot D(-1)$$

$$D(0) = C_t(0) + EV_1(0) + EV_1(-1)$$

The demodulating logic 36 detects the demodulated output which becomes 1. The output D(0) of the demodulating logic 36 is delayed by amount of T by a flip flop 37 and is fetched as the demodulated output (waveform in NRZ) at an output terminal 38. The output of the flip flop 37 is also inputted as the D(−1) to the demodulating logic 36. The discriminating signal $EV_1(0)$ from the demodulating logic 36 is supplied to a two-bits shift register 39. A discriminating signal $EV_1(-1)$ from the shift register 39 is supplied to the demodulating logic 36 and the discriminating signal $EV_1(-2)$ is supplied to the AND gate 31 through an inverter 32.

It will be obviously understood from the modulation rule (b) that the demodulated output D(0) becomes 1 when the $C_t(0)$ is 1. On the other hand, when the transition is caused at the boundary portion due to the modulation rule (c) irrespective of the fact that the data bit is 1, the discriminating signal $EV_1(0)$ becomes 1. As shown in FIG. 6A, the term of $E_g(0) \cdot C_t(-1) \cdot \overline{OD_c(-1)}$ of the foregoing logical expression becomes 1 at the last bit of 1 among the bits of 1 of an even number of four or more (four bits of 1 shown as an example) in the original data series. In case of this data series, the modulated signal $D_{IN}$ shown in FIG. 6B is supplied to the demodulating circuit.

Figure 6C:
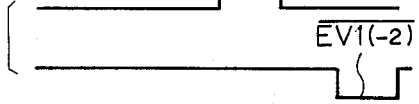

Thus, as shown in FIG. 6B, the center transition signal $C_t(-1)$ and edge transition signal $E_g(0)$ together become 1. Since the $C_t(-1)$ becomes 1 at the even-numbered bit of 1, the $OD_c(-1)$ is 0. Therefore, the $EV_1(0)$ becomes 1 as shown in FIG. 6C due to these conditions. The $\overline{EV_1(-2)}$ which is delayed by amount of 2 T by the shift register 39 becomes 0. Consequently, the center transition signal cannot pass through the AND gate 31. The reason for this is to inhibit the transition at the central portion of the bit cell of 0 which is caused due to the modulation rule (d).

As shown in FIG. 7A, the term of $E_g(0) \cdot E_g(-1) \cdot D(-1)$ in the above logical expression is used to detect the case where two bits of 1 continue in the original data series. In this case, as shown in FIG. 7B, the modulated signal $D_{IN}$ of which the transition is caused at the boundary portion of the bit cell is produced. As will be apparent from FIGS. 7A and 7B, each component of the above-mentioned term becomes 1 and, as shown in FIG. 7C, the discriminating signal $EV_1(0)$ becomes 1. In addition, when the modulation rule (d) is applied, the transition is caused at the central portion of the bit cell of 0 follows the two bits 1. The $EV_1(-2)$ is supplied to the AND gate 31 in order to inhibit the detection output of the transition at this central portion.

Other various kinds of circuit arrangements than the above-described arrangement are possible as the modulating and demodulating circuits.

What is claimed is:

1. A method of modulating digital data of a data bit series consisting of bits within respective bit cells of predetermined length, and each having a first or second state whereby a state transition is caused to satisfy predetermined conditions, comprising the steps of:
   (a) causing the transition at a boundary portion of a bit cell which is bounded on either side by bits having said second state;
   (b) causing the transition at a central portion of a bit cell of a bit having said first state, unless there are an even number of bits of said first state bounded on either side by bits of said second state or unless a pattern formed of a bit of said first state and a bit of said second state occurs after an even number of bits of said first state follow a bit of said second state;
   (c) determining an even number of bits having said first state which are bounded on either side by bits having said second state, inhibiting the transition at a central portion of each bit cell of the last two bits having the first state, and causing the transition at a boundary portion of said two bit cells having the first state; and
   (d) determining when a pattern formed of a bit having said second state and a bit having said first state appears after an even number of bits having the first state follow a bit having the second state and causing the transition at a central portion of a bit cell of the bit having the second state in said pattern.

2. A method of modulating digital data bits series consisting of bits within respective bit cells of predetermined length and each having a first or second state whereby a state transition is caused to satisfy predetermined conditions, comprising the steps of:
   (a) causing the transition at a boundary portion of a bit cell which is bounded on either side by bits having said second state;
   (b) causing the transition at a central portion of a bit cell of a bit having said first state, unless there are an even number of bits of said first state bounded by bits of said second state or unless a pattern of four bits formed of two bits of said first state bounded by bits of said second state occurs after an even number of bits of said first state that follows a bit of said second state;
   (c) determining an even number of bits having said first state which are bounded on either side by bits having said second state, inhibiting the transition at a central portion of each bit cell of the last two bits having the first value and causing the transition at a boundary portion of said last two bit cells having the first value; and
   (d) determining when a pattern of four bits formed of two bits having said first state bounded by bits having the second state appears after an even number of bits having the first state that follows a bit having the second state and causing the transition at a central portion of a bit cell of the first bit having the second state in said pattern of four bits.

3. A method of modulating digital data of a data bit series consisting of bits within respective bit cells of predetermined length and each having a first or second state, whereby a state transition is caused to satisfy predetermined conditions, comprising the steps of:
   (a) causing the transition at a boundary portion of a bit cell which is bounded on either side by bits having said second state;
   (b) causing the transition at a central portion of a bit cell of a bit having said first state, unless an even number of bits of said first state are bounded by bits of said second state or unless a two bit pattern of a bit of said second state and a bit of said first state follows an even number of bits of said first state that is after a bit of said second state;
   (c) determining an even number of bits having said first state which are bounded on either side by bits having said second state, inhibiting the transition at a central portion of each bit cell of the last two bits having the first state, and causing the transition at a boundary between said last two bit cells having the first state; and
   (d) determining when a two-bit pattern formed of a bit having said second state and a bit having said first state appears after an even number of bits having the first state that follows a bit having the second state and causing the transition at a central portion of a bit cell of the bit having the second state of the two-bit pattern.

* * * * *